United States Patent
Wang et al.

(10) Patent No.: US 8,477,527 B2
(45) Date of Patent: Jul. 2, 2013

(54) SRAM TIMING CELL APPARATUS AND METHODS

(75) Inventors: Li-Wen Wang, Taichung (TW); Shao-Yu Chou, Chu-Pei (TW); Jihi-Yu Lin, Taichung (TW); Wei Min Chan, Sindian (TW); Yen-Huei Chen, Jhudong Township (TW); Ping Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 240 days.

(21) Appl. No.: 13/017,793

(22) Filed: Jan. 31, 2011

(65) Prior Publication Data

US 2012/0195106 A1    Aug. 2, 2012

(51) Int. Cl.
G11C 11/00 (2006.01)

(52) U.S. Cl.
USPC ....... 365/154; 365/201; 365/207; 365/233.11

(58) Field of Classification Search
USPC .............................. 365/154, 201, 241, 233.11
See application file for complete search history.

(56) References Cited

U.S. PATENT DOCUMENTS

| 5,046,045 | A  | * | 9/1991  | Ebel et al. ................. 365/189.15 |
| 2007/0008771 | A1 | * | 1/2007  | Lee et al. ...................... 365/154 |
| 2007/0127287 | A1 |   | 6/2007  | Liaw |
| 2008/0298142 | A1 | * | 12/2008 | Chen et al. .................... 365/194 |

* cited by examiner

*Primary Examiner* — Pho M Luu
*Assistant Examiner* — Thao Bui
(74) *Attorney, Agent, or Firm* — Slater & Matsil, L.L.P.

(57) ABSTRACT

Apparatus and methods for providing SRAM timing tracking cell circuits are disclosed. In an embodiment, an apparatus comprises an SRAM array comprising static random access memory cells arranged in rows and columns; a plurality of word lines each coupled to memory cells along one of the rows; a clock generation circuit for outputting clock signals; a word line generation circuit for generating a pulse on the plurality of word lines responsive to one of the clock signals and for ending the pulse responsive to one of the clock signals; and a tracking cell for receiving a clock signal and for outputting a word line pulse end signal to the clock generation circuit, following an SRAM tracking time; wherein the tracking cell further comprises SRAM tracking circuits positioned in the SRAM array and coupled in series to provide a signal indicating the SRAM tracking time. Methods for SRAM timing are disclosed.

20 Claims, 5 Drawing Sheets

SRAM TIMING CELL APPARATUS AND METHODS

BACKGROUND

A common requirement for an advanced electronic circuit and particularly for circuits manufactured as integrated circuits ("ICs") in semiconductor processes is the use of static RAM ("SRAM") memory cells for storage. More recently, embedded SRAM arrays are provided as part of integrated circuits that include other functions, such as radio transceivers, microprocessors, microcontrollers, processors, cell phone circuitry and the like to provide a system on a chip "SoC" device. Increasingly, the SRAM designs are provided as "cores" or "macros" that are included with other functionality on an integrated circuit such as an application specific integrated circuit ("ASIC").

In order to properly determine the access time needed for read cycles, a timing generation circuit provides a word line ("W/L") pulse of a certain duration. The timing of this pulse is very important to the power consumption, SRAM access speed, and efficient operation of the SRAM array. In any case, the goal is to make the W/L pulse long enough for proper operation, but not too long, which results in wasted power.

The operation of an SRAM depends on sense amplifiers which are coupled to the column or "bit lines". The bit lines are coupled to the cells in order to provide the read data from (and write data to) the SRAM cells. An SRAM cell is often a 6 transistor cell which has two inverters coupled to form a latch. The cross coupled inverters will maintain a stored datum indefinitely so long as power is maintained to the device. In addition, a pair of pass gates couple the inverter latch to a true and a complement bit line. Because the SRAM cells are static memory cells, they need not be clocked or refreshed to maintain a stored datum. This makes SRAM storage very attractive and particularly useful in devices which have standby or "sleep" modes, including as embedded portions of the processors or other ICs for cellphones, PDAs, portable devices of all kinds, music and video players, etc. The device including the SRAM cells may enter a standby or low power mode for many cycles and then, when needed, processing may restart without any loss of data.

An SRAM read cycle begins with the bit lines, which are configured as pairs of true and complement data carrying lines, precharged or equalized to a common voltage, such as Vdd or Vdd/2. The bit lines are often referred to as "column lines" but the physical orientation or the SRAM layout does not affect the function of the lines. One common arrangement provides rows of cells coupled to and arranged on a common word line, and columns of cells arranged on a common pair of bit lines However, alternative arrangements such as diagonal and folded bit lines, and various other arrangements for the cell layouts are possible, so in this application the terms "word lines" and "bit lines" are used without regard to the direction, or relative layout arrangement, selected. When an active word line rises to an active level, the pass gates in a selected memory cells coupled to that word line become active and couple the paired bit lines to the SRAM cell, and to the stored data. The bit lines begin at a precharged level, but after the read cycle begins, one of the two bit lines in the bit line pair will begin to fall to a lower voltage level. However, as is known in the art, it is not necessary for the bit lines to fall to a logical low level voltage (such as Vss or zero volts) because small signal differential voltage sensing is used.

The sense amplifiers, which are a portion of the output or read circuits for the SRAM array, receive both of the bit lines of the bit line pair into a differential amplifier. The sense amplifier input circuit detects a small signal voltage difference between the bit line pair and then latches a data value that corresponds to the stored data in the SRAM cell. The sense amplifier also amplifies this small signal voltage to a full logic level output signal for use by external logic circuitry. Often an I/O circuit provides an output latch and output drivers. The output latch may be clocked to provide the data at a definite point in time, for use by the synchronous logic in the rest of the integrated circuit or system.

By using the small signal sensing, the sense amplifiers can rapidly determine the value on the bit lines and provide a full logic level output. Thus, the SRAM read cycle may be shortened in duration, because the small signal voltage difference on the bit lines that can be sensed correctly is only a few hundred millivolts. It is not necessary to extend the SRAM read cycle to the full time that would be needed to completely discharge the lower bit line of the pair; instead, it is only necessary to provide a read cycle of long enough duration to allow a sufficient small differential voltage to develop between the bit lines. The use of differential sensing thus greatly improves the data access time (speeds up the SRAM read cycle).

In order to ensure the word line pulse to the SRAM array is of sufficient duration to enable proper bit line separation during an SRAM read operation, but that the duration is not too long, SRAM tracking cells are conventionally used. In a conventional SRAM array, the tracking cells are parallel cells arranged in correspondence with the bit lines, so that the layout of the SRAM array is regular and compact. Thus the number of tracking cells is limited by the number of bit lines in the array, and the position of the tracking cells is limited by the layout of the array. The tracking cells are used to emulate the bit cells, and to provide an emulation of the loading on the word line and the bit lines. By providing the tracking circuits in the actual array, local variations (due to process variations in, for example, transistor drive or inter line capacitance) and global variations in different portions of the array can be emulated. However in conventional SRAM tracking cells used in SRAM arrays, the tracking time obtained does not emulate the real discharge time of the SRAM cell array. A. Global variations and local variations may not be accurately represented in the tracking circuit. As a result, word line pulse duration is often generated with extra margin (too much time) to ensure proper operation.

A continuing need thus exists for SRAM timing tracking circuits and methods that overcome the disadvantages of the prior art approaches. The tracking circuits should be compatible with existing semiconductor processes and circuits and be implemented without the need for added process steps or materials.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In an embodiment, an SRAM tracking circuit is provided that is used in a series connection in an SRAM array to provide W/L pulse duration timing. The SRAM tracking circuits have a word line loading section that is designed to provide a "word line load/N" value for the word line input, similarly there is a bit line loading section that provides a "bit line load/N" value for a cell inverter. The transistors in the tracking circuit emulate the SRAM bit cell. For each of N tracking circuits, these values are used. The N tracking circuits are coupled in series and provide a timing that accurately represents the global and local variations in the SRAM array so that the W/L pulse duration that results is of sufficient length to allow the bit line differential voltage needed to develop, but is not of longer duration than necessary, providing fast read cycles and reducing unnecessary power consumption.

Figure 1:
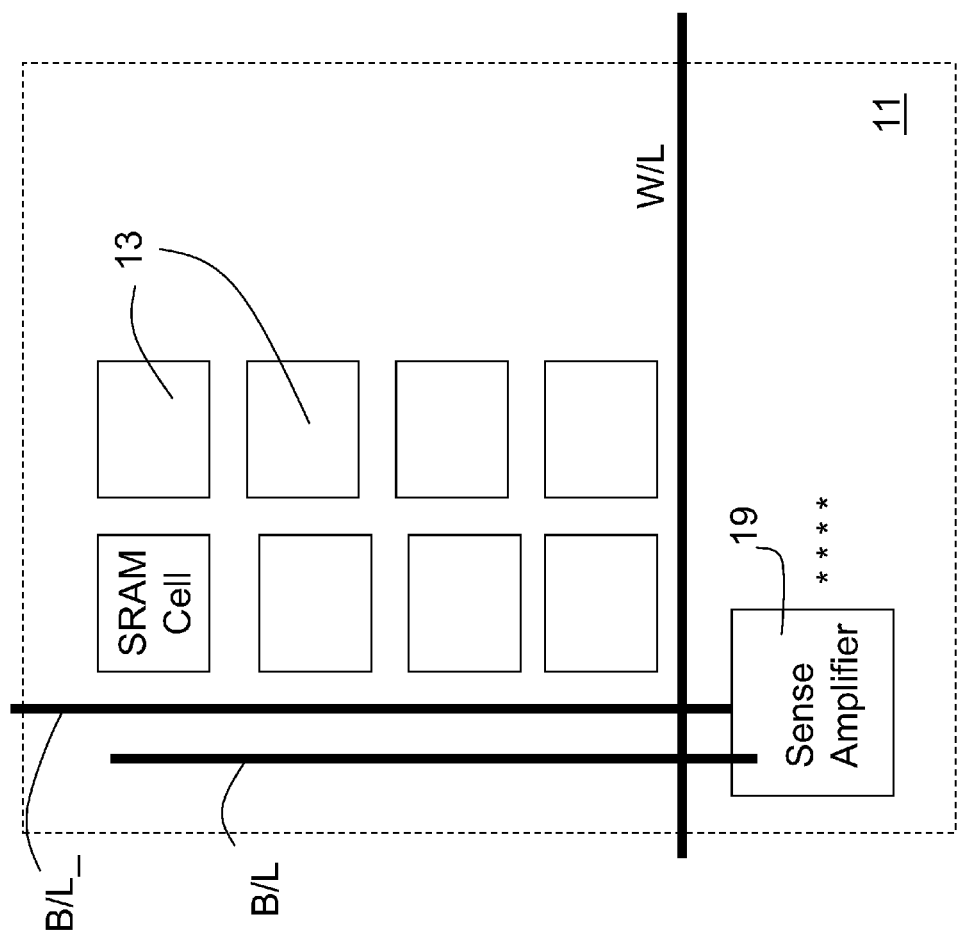
FIG. 1 depicts in a block diagram an array of SRAM cells for use with an embodiment.

FIG. 1 depicts in a simple block diagram an SRAM array 11 for use with the embodiments. The SRAM array 11 may be used as part of an integrated circuit that incorporates other functions, such as an application specific integrated circuit ("ASIC"), or it may be used as part of a dedicated SRAM integrated circuit device. The SRAM array 11 includes many SRAM cells 13, each of which stores a single datum or bit. The data stored will be described as a stored "0" or stored "1" corresponding to binary data. The voltage read from and written to the SRAM cells can be high or low, and either voltage may be arbitrarily assigned to either a logical "1" or logical "0" value. For convenience, a low voltage output is described here as representing a "0" logic level, but this may be modified without affecting the operation of the embodiments.

SRAM array 11 also includes word lines W/L and complementary bit lines B/L and B/L_. The bit lines are true and complement pairs and conduct the data to be stored into, and out of, the SRAM cells. The bit lines are typically arranged in columns and one pair of bit lines B/L and B/L corresponds to a single bit in a word. The SRAM array may be of any convenient width, such as 8 bits, 16 bits, 32 bits, 64 bits, etc. and many sub-arrays are typically used. A 128K word SRAM may have 1 Million bits-1 Mbit) if 8 bit words are used, or 4 Mbits if 32 bit words are used. These are illustrative, non-limiting examples. Many sub-arrays are typically used to form the SRAM array. Local and global bit lines are used to distribute the loading and provide additional drive and fan out as needed.

Each pair of bit lines B/L and B/L_ is coupled to at least one sense amplifier 19. The sense amplifiers use differential sensing to sense a small signal differential voltage, which may be as small as 100 millivolts, for example, to determine the voltage corresponding to the value stored in the SRAM cell. Differential sensing provides very fast operation, as the bit lines do not have to be fully charged or discharged to a full logic level voltage during read cycles.

Figure 2:
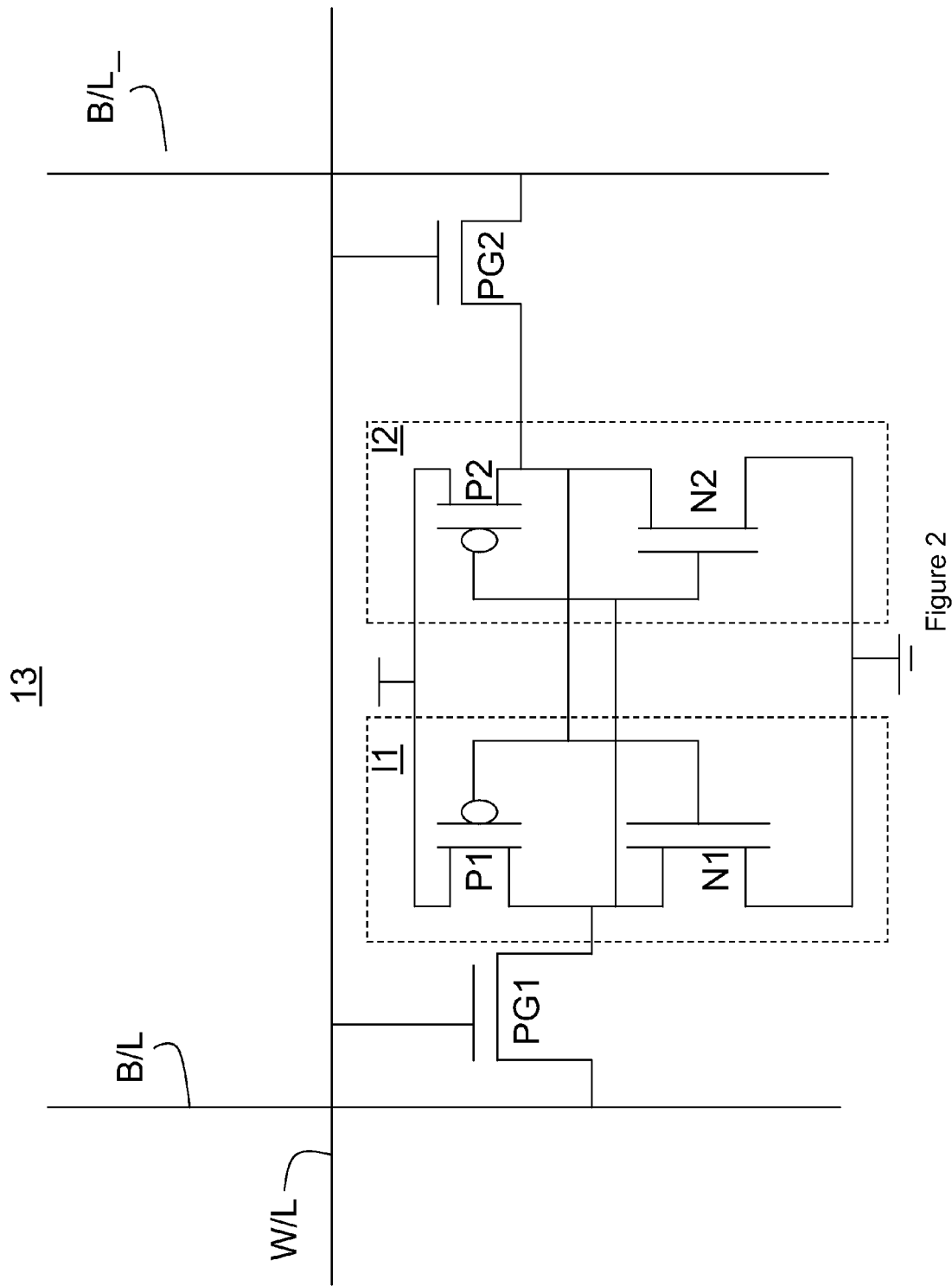
FIG. 2 depicts in a circuit diagram an SRAM bit cell for use with an embodiment.

FIG. 2 depicts in a circuit diagram a typical 6T SRAM cell 13 that may be used with the embodiments. Other arrangements for SRAM cells may be used, such as 8T cells, but the 6T cell is one useful SRAM cell. In FIG. 2 a pair of inverters I1 and I2 are cross coupled to form a latch. Inverter I1 is a CMOS inverter of PMOS transistor P1 and NMOS transistor PD1. Similarly, I2 is a CMOS inverter of PMOS transistor P2 and NMOS transistor PD2. The word line is coupled to the pass gates PG1, PG2 and sees a load due to the path to ground through the NMOS transistor PD1, PD2. Because the inverters I1 and I2 are cross-coupled to reinforce the output values, the latch will retain the stored value indefinitely so long as there is power to the transistors.

In operation, a memory cycle begins with a precharge phase. The bit lines BL and BL_ will take an initial voltage, typically Vdd or Vdd/2. When a read cycle begins, the word line W/L will have a rising edge of a word line pulse placed on it by the word line generation circuitry (not shown). The pass gates PG1 and PG2 will receive the rising edge and when the W/L voltage exceeds a threshold for these devices, they will turn on and couple the storage nodes (the gates of the transistors P1, PD1, P2, PD2 respectively) to the bit lines. One of the bit lines B/L and B/L_ will then start to fall, while the other remains high, depending on the data stored in the cell. The cell literally "pulls down" or discharges one of the bit lines. When the differential voltage between the two bit lines reaches a sufficient "delta V" value, say 100 millivolts or a few hundred millivolts, a sense amplifier (not shown in FIG. 2) coupled to the bit lines can sense the voltage difference and latch the stored data value.

Figure 3:
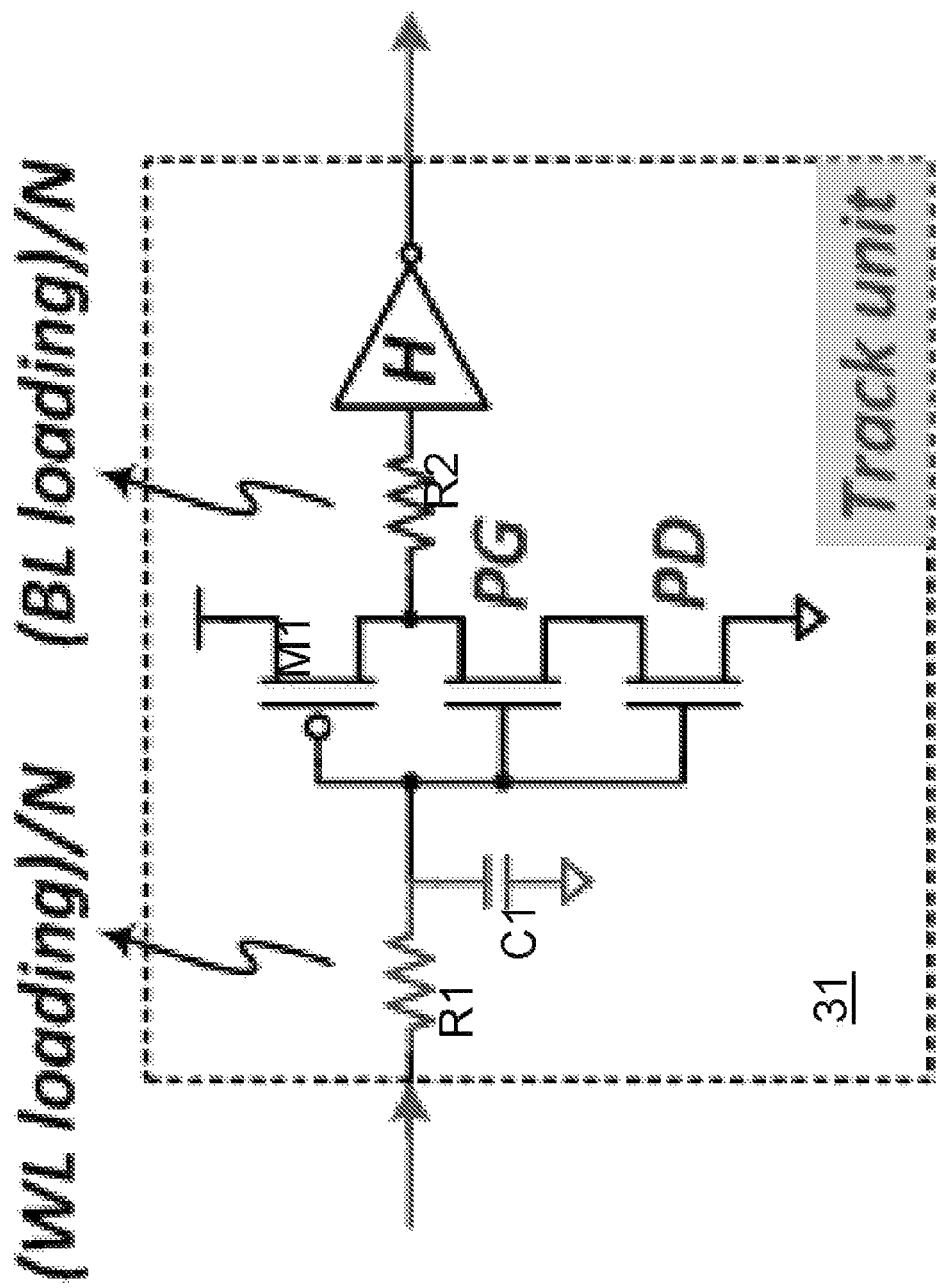
FIG. 3 depicts in a circuit diagram an SRAM tracking cell embodiment.

FIG. 3 depicts an embodiment tracking circuit 31 in a circuit diagram. Tracking circuit 31 includes a load circuit formed of resistor R1 and capacitor C1. This load circuit is designed to form a load corresponding to the "word line loading/N," where N is an integer that is the number of tracking circuits. While various numbers of tracking circuits may be used, a greater number provides better tracking (more tracking circuits adds to the sensitivity to global variations across the array) and the number N is usually selected to be greater than 8, and many more may be used. The circuit inverter formed of PMOS transistor M1, NMOS transistor PG and NMOS transistor PD form a circuit that emulates the devices within the SRAM cell circuit. The current flowing in the tracking circuit emulates the SRAM cell circuit. A load resistor R2 is coupled to the output of this inverting circuit and is selected to have a value corresponding to the bit line loading BL/N, again N is the number of tracking circuits that will be used. An output driver inverter H having high skew completes the tracking circuit. The tracking circuit emulates the loading and the delays of an SRAM bit cell.

Figure 4:
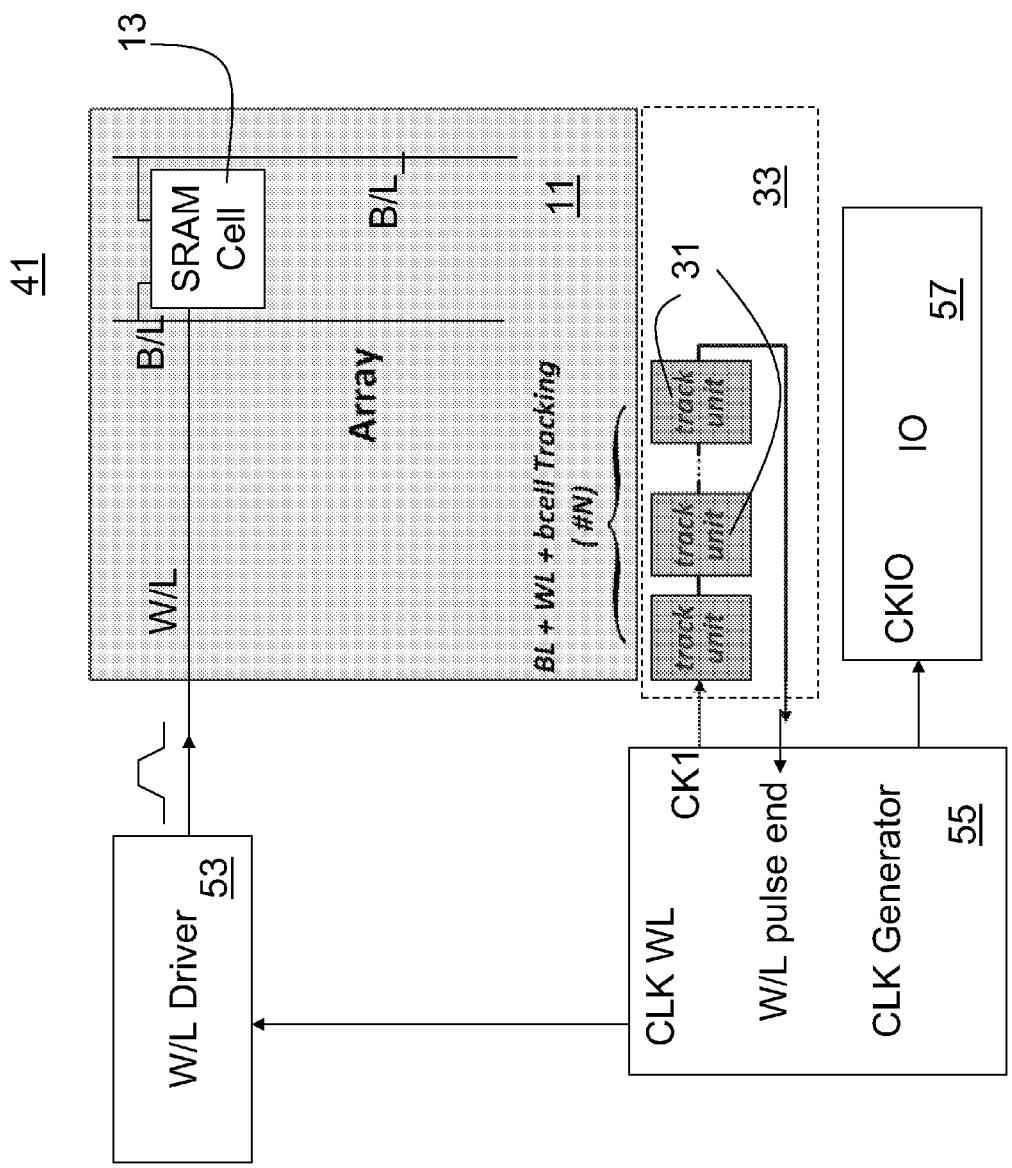
FIG. 4 depicts in a circuit diagram an SRAM circuit embodiment including the tracking cells of FIG. 3.

FIG. 4 depicts in a simplified block diagram an embodiment SRAM circuit 41 using the tracking circuit of FIG. 3. In FIG. 4, a word line (W/L) driver circuit 53 outputs a pulse on the word lines in the SRAM array 11, which includes many SRAM cells 13. Bit line pairs B/L and B/L_ are arranged in columns and coupled to columns of the SRAM cells 13. A tracking cell 33 is formed of a plurality of N SRAM tracking circuits 31, which are coupled in series. N is an integer. In contrast to the parallel arranged tracking circuits of the prior art, the SRAM tracking circuits 31 need not be aligned with or positioned in correspondence with the bit lines, and any number of N tracking circuits may be used. Thus the number of SRAM tracking circuits may be greater than the number of bit lines in the array, for example, so as to achieve greater sensitivity to global and local process variations within the array 11.

A clock (CLK) generator 55 is depicted with outputs CK1 coupled as an input to the SRAM tracking cell 33, and a clock output is coupled to the word line driver circuit 53. An IO unit 57 is depicted and receives a clock signal CKIO from the clock generator. The IO unit may include latches or registers and driving buffers, and will receive the data output from the sense amplifiers (not shown for clarity) in array 11 and will provide a clocked output for external circuitry to receive the read data from the SRAM cells.

In operation, the clock generator 55 begins a read operation by providing a clock edge to the word line driver 53. The word line driver outputs the rising W/L pulse to the word line in SRAM array 11. The pulse on the word line begins the read cycle by coupling the bit lines to the selected SRAM cells (the SRAM cells along an active word line, or row). At about the same time, a rising edge is output on CK1 to the SRAM tracking circuit 33. When the edge of this signal traverses the series of tracking circuits 31 in the tracking circuit 33, an output returns to the clock generator 55 indicating the end of the W/L pulse. The CLK generator 55 then ends the clock pulse to W/L driver 53, and the word line W/L falls in the SRAM array 11, ending the read operation.

Because the duration of the word line pulse is determined by the tracking circuits 31 which are placed within the SRAM array, the word line duration is calibrated to the loading on the bit lines and the word lines, and to the global and the local variations within the array 11. Note that the signals shown in this simplified block diagram are provided as one non-limiting alternative embodiment, but additional or fewer clock signals could be used, the clock generator 55 could be combined with the IO circuit 57, with the word line driver circuit 53, or any other combination, and other modifications could be made that are contemplated as alternative embodiments and which fall within the scope of the appended claims.

Figure 5:
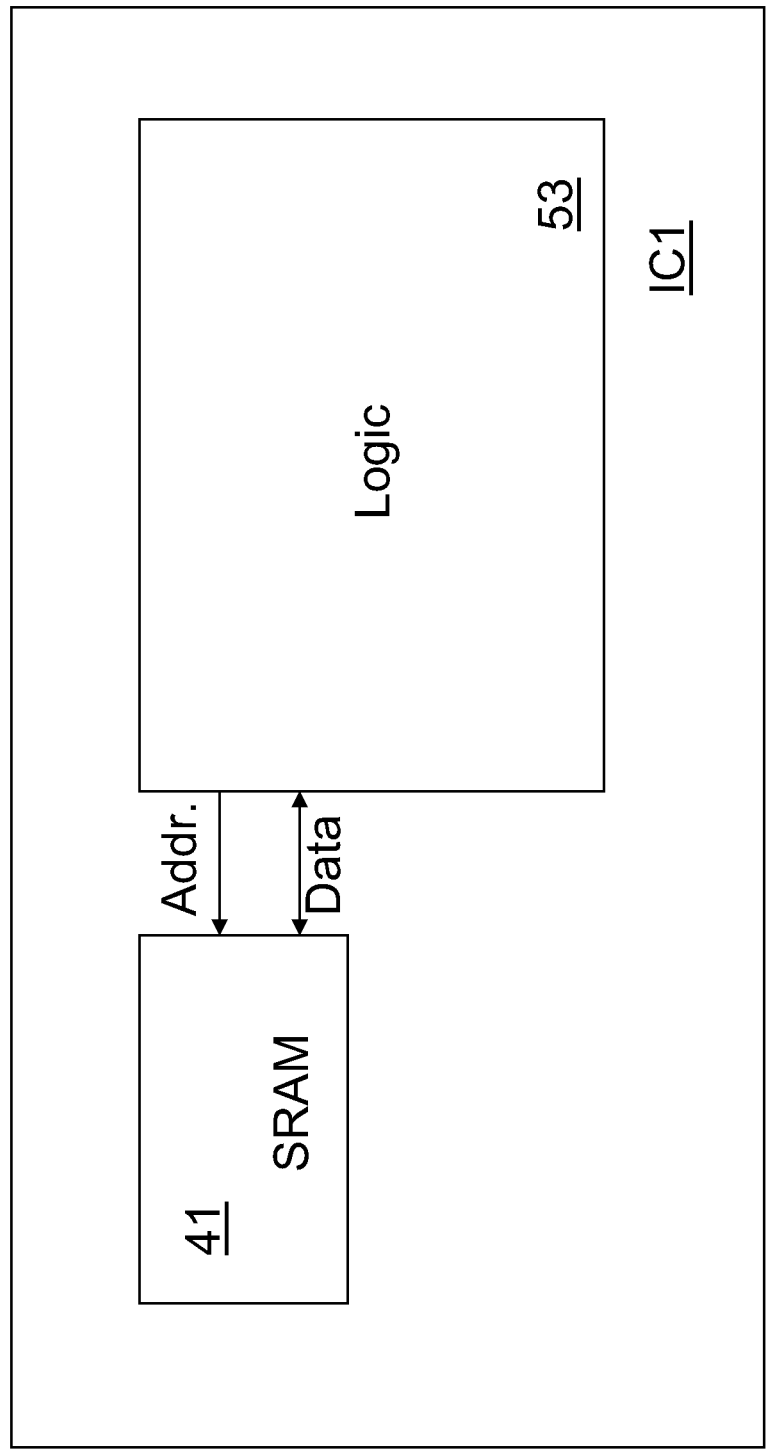
FIG. 5 depicts in a block diagram an integrated circuit including an embedded SRAM embodiment.

FIG. 5 depicts a simple block diagram of an integrated circuit IC1 including the embodiment SRAM 41 of FIG. 4, and in addition, user defined logic 53. The logic may implement any number of functions such as processors, microprocessors, digital signal processors, radio functions such as transceivers, mixed signal functions, etc. The user defined logic may provide signals such as address signals to the SRAM array 41, which is now an embedded SRAM block, and may send write data to be stored, or receive read data from the SRAM array, as shown by the bidirectional "Data" bus in the figure.

In an ideal tracking circuit, the bit line discharge time needed to provide the appropriate sense amp inverter trip voltage, for example a delta voltage of 100 millivolts, could be determined as:

$$T_{perfect.} = \frac{C_{bl} * \Delta V_{trip\_100mV}}{I_{cell}} \equiv T_{bl} \qquad \text{(Equation 1)}$$

Using a conventional parallel SRAM tracking circuit, the BL discharge time is usually estimated as:

$$T_{track\_con.} = \frac{C_{bl} * \Delta V_{trip\_500mV}}{8 I_{cell}} = 0.625 T_{bl} \qquad \text{(Equation 2)}$$

The above time $T_{track\_con}$ assumes 8 tracking circuits, and the discharge voltage is measured using a 500 millivolt bit line discharge voltage, which is often greater than the delta voltage needed by the sense amplifiers. The trip voltage is limited by the cell operation voltage. The discharge time provided by the conventional tracking circuits does not accurately track the bit line discharge time.

Using the embodiment tracking circuit of FIG. 3, in an array embodiment such as FIG. 4, an emulation of the real discharge time result is obtained. For the embodiments of FIGS. 3 and 4, the time $T_{track\_pro}$ can be expressed as:

$$T_{track\_pro.} = \frac{\frac{C_{bl}}{N} * \Delta V_{trip\_100mV}}{I_{cell}} * N = T_{bl}. \qquad \text{(Equation 3)}$$

Thus, the use of the embodiments provides a tracking time that accurately reflects the real B/L discharge time, and the actual line loadings and the local and global variations in the SRAM array. The number of tracking circuits N is not limited to the number of bit lines and the tracking circuits may be positioned in a variety of locations in the array, the positions are not limited by the array layout. The design and layout of the tracking circuit is easy to implement and not limited by the array size. The word line pulse length obtained using the embodiments is thus optimized to provide a better tracking ratio; where the tracking ratio is the time from clock-to-data-Q over the bit line discharge time. Using the embodiments, a proper word line pulse width is generated, providing proper operation but keeping the word line pulse duration short, speeding up the read cycle time and saving power in the SRAM array that would other wise be consumed.

In an embodiment, an apparatus comprises an SRAM array comprising static random access memory cells arranged in rows and columns; a plurality of word lines each coupled to memory cells along one of the rows; a plurality of true and complement bit line pairs, each bit line pair coupled to memory cells along one of the columns; sense amplifiers coupled to one of the true and complement bit line pairs for sensing a differential voltage on the bit line pair; a clock generation circuit for outputting clock signals; a word line generation circuit for generating a pulse on the plurality of word lines responsive to one of the clock signals and for ending the pulse responsive to one of the clock signals; and a tracking cell for receiving a clock signal and for outputting a word line pulse end signal to the clock generation circuit, following an SRAM tracking time; wherein the tracking cell further comprises SRAM tracking circuits positioned in the SRAM array and coupled in series to provide a signal indicating the SRAM tracking time.

In another embodiment, an integrated circuit comprises: user defined circuitry formed on a semiconductor substrate; and an embedded SRAM circuit formed on the semiconductor substrate, the embedded SRAM circuit further comprising: an SRAM array comprising static random access memory cells arranged in rows and columns; a plurality of word lines each coupled to memory cells along one of the rows; a plurality of true and complement bit line pairs, each bit line pair coupled to memory cells along one of the columns; sense amplifiers coupled to one of the true and complement bit line pairs for sensing a differential voltage on the bit line pair; a clock generation circuit for outputting clock signals; a word line generation circuit for generating a pulse on the plurality of word lines responsive to one of the clock signals and for ending the pulse responsive to one of the clock signals; and a tracking circuit for receiving a clock signal and for outputting a word line pulse end signal to the clock generation circuit, following an SRAM tracking time; wherein the tracking circuit further comprises SRAM tracking cell circuits each having an input and an output and positioned in the SRAM array and coupled in series, the tracking circuits each forming an emulation circuit emulating a portion of the bit line loading and word line loading, and each emulating an SRAM cell.

In another embodiment, a method comprises providing an SRAM array comprising a plurality of SRAM bit cells arranged in rows and columns; coupling a plurality of word lines to SRAM bit cells arranged along rows of the SRAM array; coupling a plurality of bit line pairs to SRAM bit cells arranged in columns of the SRAM array; coupling sense amplifiers to each of the bit line pairs to sense s differential voltage developed between the bit line pairs during an SRAM read operation; providing an SRAM tracking circuit comprising a plurality of SRAM tracking cells disposed within the SRAM array, each having an input and an output and coupled in series, the SRAM tracking circuit receiving a clock edge and outputting a word line pulse end signal following an SRAM tracking time.

Moreover, the scope of the present application is not intended to be limited to the particular embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An apparatus, comprising:
an SRAM array comprising static random access memory cells arranged in rows and columns;
a plurality of word lines each coupled to memory cells along one of the rows;
a plurality of true and complement bit line pairs, each bit line pair coupled to memory cells along one of the columns;
sense amplifiers coupled to one of the true and complement bit line pairs for sensing a differential voltage on the bit line pair;
a clock generation circuit for outputting clock signals;
a word line generation circuit for generating a pulse on the plurality of word lines responsive to one of the clock signals and for ending the pulse responsive to one of the clock signals; and
a tracking cell for receiving a clock signal and for outputting a word line pulse end signal to the clock generation circuit, following an SRAM tracking time;
wherein the tracking cell further comprises SRAM tracking circuits positioned in the SRAM array and the tracking circuits are coupled in series between the clock signal and the word line pulse end signal to provide a signal indicating the SRAM tracking time.

2. The apparatus of claim 1, wherein the tracking cell further comprises N SRAM tracking circuits, where N is a positive integer greater than or equal to 1.

3. The apparatus of claim 2, wherein the SRAM tracking circuits each further comprise a word line load that corresponds to an estimated word line load over N.

4. The apparatus of claim 3, wherein the word line load in the tracking circuits each comprise a resistor that corresponds to an estimated word line resistor over N.

5. The apparatus of claim 4, wherein the word line load in the tracking circuits each comprise a capacitor that corresponds to an estimated word line capacitor over N.

6. The apparatus of claim 1, wherein the tracking circuits each comprise a circuit that emulates an SRAM bit cell circuit.

7. The apparatus of claim 3, wherein the tracking circuits each comprise a resistor that corresponds to an estimated bit line load over N.

8. The apparatus of claim 2, wherein N is greater than 8.

9. An integrated circuit comprising:
user defined circuitry formed on a semiconductor substrate; and
an embedded SRAM circuit formed on the semiconductor substrate, the embedded SRAM circuit further comprising:
an SRAM array comprising static random access memory cells arranged in rows and columns;
a plurality of word lines each coupled to memory cells along one of the rows;
a plurality of true and complement bit line pairs, each bit line pair coupled to memory cells along one of the columns;
sense amplifiers coupled to one of the true and complement bit line pairs for sensing a differential voltage on the bit line pair;
a clock generation circuit for outputting clock signals;
a word line generation circuit for generating a word line pulse on at least one of the plurality of word lines responsive to one of the clock signals and for ending the pulse responsive to one of the clock signals; and
a tracking cell for receiving a clock signal and for outputting a word line pulse end signal to the clock generation circuit, following an SRAM tracking time;
wherein the tracking cell further comprises SRAM tracking circuits, each having an input and an output and positioned in the SRAM array and coupled in series to provide a signal indicative of the SRAM tracking time.

10. The integrated circuit of claim 9, wherein the tracking cell further comprises N SRAM tracking circuits, where N is a positive integer greater than or equal to 1.

11. The integrated circuit of claim 10, wherein the SRAM tracking circuits each further comprise a word line load that corresponds to an estimated word line load over N.

12. The integrated circuit of claim 11, wherein the word line load in the SRAM tracking circuits each comprise a resistor that corresponds to an estimated word line resistor over N.

13. The integrated circuit of claim 12, wherein the word line load in the SRAM tracking circuits each further comprise a capacitor that corresponds to an estimated word line capacitor over N.

14. The integrated circuit of claim 10, wherein the SRAM tracking circuits each comprise a circuit that emulates an SRAM bit cell circuit.

15. A method, comprising:
providing an SRAM array comprising a plurality of SRAM bit cells arranged in rows and columns;
coupling a plurality of word lines to SRAM bit cells arranged along rows of the SRAM array;
coupling a plurality of bit line pairs to SRAM bit cells arranged in columns of the SRAM array;
coupling sense amplifiers to each of the bit line pairs to sense s differential voltage developed between the bit line pairs during an SRAM read operation;
providing an SRAM tracking cell comprising a plurality of SRAM tracking circuits disposed within the SRAM array, each having an input and an output and coupled in series; and importing a clock to an SRAM tracking circuit and outputting a word line pulse end signal following an SRAM tracking time.

16. The method of claim 15, wherein the SRAM tracking cell comprises N of the SRAM tracking circuits, where N is a positive integer greater than or equal to 1.

17. The method of claim 16, wherein each of the N SRAM tracking circuits has a delay from the input to the output, each delay corresponding to the product of an estimated bit line capacitance over N, multiplied by a voltage difference corresponding to a predetermined bit line discharge voltage, the product divided by the current consumed in the tracking cell.

18. The method of claim 17, wherein the SRAM tracking time is a product of N multiplied by the SRAM tracking circuits delays.

19. The method of claim 15, wherein N is greater than 8.

20. The method of claim 16, wherein providing the SRAM tracking cell comprises providing a plurality of the SRAM tracking circuits, each comprising an word line load that corresponds to an estimated word line load/N; and each comprising a bit line load that corresponds to an estimated bit load over N.

* * * * *